United States Patent
Engemann

[19]

[11] Patent Number: 5,177,398
[45] Date of Patent: Jan. 5, 1993

[54] GRID ASSEMBLY FOR ION BEAM SOURCES AND METHOD THEREFOR

[75] Inventor: Jurgen Engemann, Wuppertal, Fed. Rep. of Germany

[73] Assignee: Commonwealth Scientific Corporation, Alexandria, Va.

[21] Appl. No.: 530,857

[22] Filed: May 31, 1990

[51] Int. Cl.$^5$ .............................................. H01J 1/88
[52] U.S. Cl. ........................... 313/360.1; 315/111.81; 313/268
[58] Field of Search .................... 315/111.81; 313/268, 313/360.1, 355, 297

[56] References Cited

U.S. PATENT DOCUMENTS

| | | | |
|---|---|---|---|
| 2,899,590 | 8/1959 | Sung et al. | 313/268 |
| 3,944,873 | 3/1976 | Franks et al. | 313/111.81 |
| 4,446,403 | 5/1984 | Cuomo et al. | 315/118.81 |
| 4,873,467 | 10/1989 | Kaufman et al. | 313/360.1 |

FOREIGN PATENT DOCUMENTS

| | | |
|---|---|---|
| 3601632 | 7/1987 | Fed. Rep. of Germany . |
| 0093836 | 4/1987 | Japan ............................ 313/231.31 |

OTHER PUBLICATIONS

J. L. Speidell, J. M. E. Harper, J. J. Cuomo, A. W. Kleinsasser, H. R. Kaufman, and A. H. Tuttle "The Fabrication and Use of Silicon and Gallium Arsenide Ion Source Extraction Grids" J. Vac. Sci. Technol., 21(2), Sep./Oct. 1982 pp. 824–827.

Primary Examiner—Donald J. Yusko
Assistant Examiner—N. D. Patel
Attorney, Agent, or Firm—Cushman, Darby & Cushman

[57] ABSTRACT

A grid assembly for ion beam sources includes grid structures that are etched from a semiconductor wafer using microelectronic fabrication techniques with the grid structures constrained in an aligned manner by a ceramic carrier having embedded electrically conductive pads for effecting electrical contact with the grid structures. The grid structures are fabricated by creating oxide and photoresist layers on a starting silicon wafer and exposing the photoresist through a mask carrying the aperture pattern. After the photoresist is developed, the oxide layer is etched to form openings therethrough and the silicon wafer is anisotropically etched from both sides with the etching proceeding anisotropically so that the {111} planes are etched to form the apertures in which the {111} planes face each other across the aperture with opposite {111} planes at a 90° angle relative to one another to provide a plurality of apertures each defining a volume in the form of an inverted truncated 4-sided pyramid. The ceramic carrier is assembled as a preform from a flexible $Al_2O_3$/polymer dielectric tape and is initially fabricated by cutting the various laminae $L_1, L_2, L_{n-1}, \ldots L_n$ into the desired configuration and assembling the laminae in a stacked configuration for burnout and firing to form a unitary ceramic carrier. The etchant formed grids are cemented into place in the carrier with an electrically conductive high-temperature cement.

12 Claims, 4 Drawing Sheets

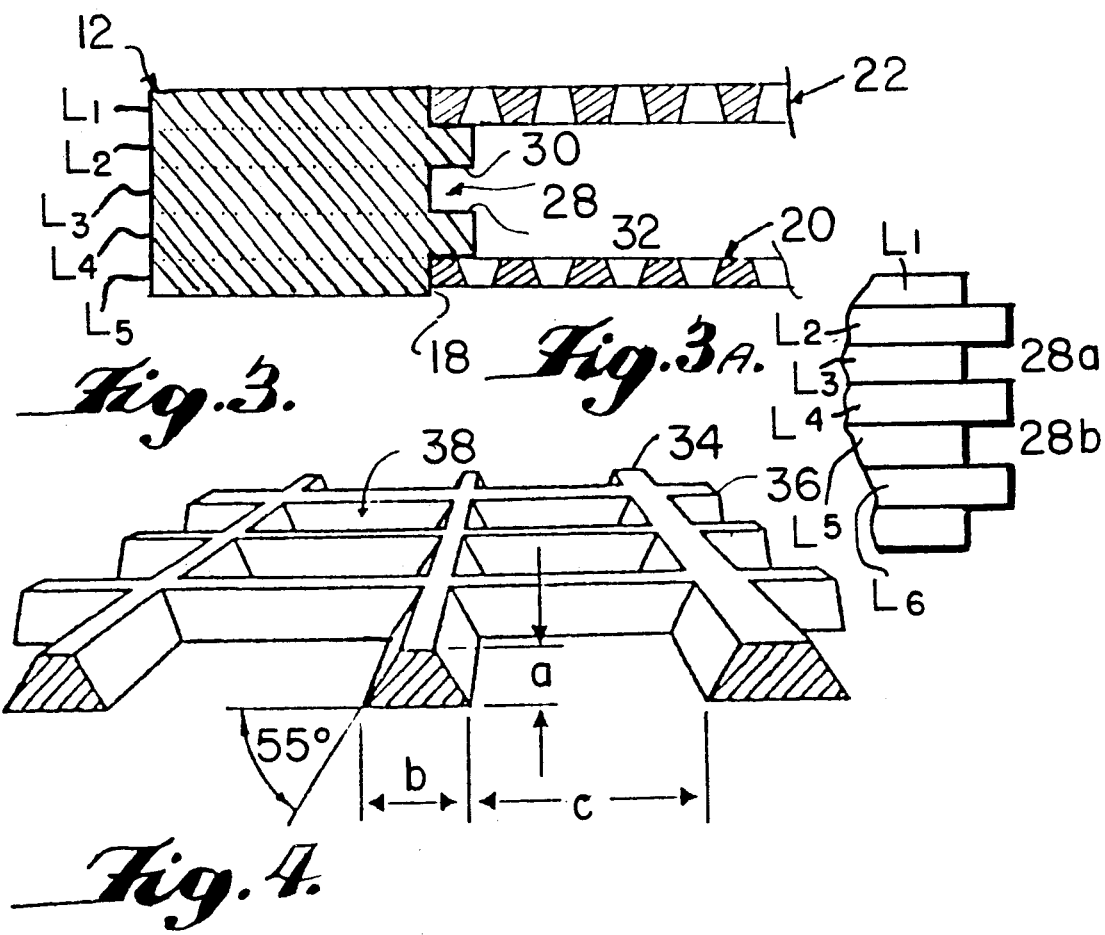
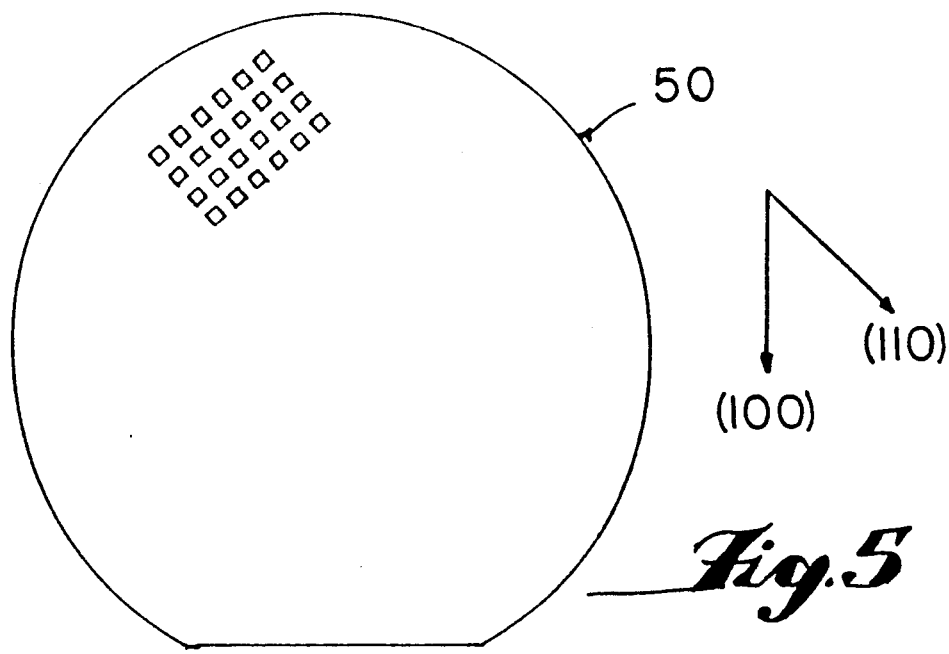

GRID ASSEMBLY FOR ION BEAM SOURCES AND METHOD THEREFOR

BACKGROUND OF THE INVENTION

The present invention relates to a grid assembly for ion beam sources and method therefor and, more particularly, to integrated single- and multi-grid assemblies and methods therefor for use in ion beam systems that are used for various surface treatments including etching and material deposition.

Ion beams are used in various processes including the reactive and non-reactive deposition of materials onto substrates, etching of metals, semiconductors, and insulating materials, and the surface treatment of materials. In ion beam deposition, the ion beam strikes a target to release atoms which then travel to substrates where the atoms nucleate. This type of operation often requires a focused ion beam of sufficient energy in order to release target atoms at a practical rate.

Whether the ion beams are used for etching or for deposition, the ion beam source typically includes one or more grids that provide a desired beam profile and direction. The use of these grids allows the production and focussing of ion beams of different energies so that the ion beam can be tailored to the desired application. A typical ion source is mounted in a vacuum chamber or other low pressure environment for sputtering atomic particles from a target onto a substrate. The ion source includes a main body that contains an electrically heated cathode, one or more anode elements, and a magnetically constrained plasma chamber into which a working gas, such as argon, is introduced. The exit end of the ion source includes at least one multi-apertured grid through which ions pass and, in many cases, a two-grid set having a first screen grid and a second accelerator grid. Lastly, a neutralizer wire can extend across a diameter line at the exit end of the ion source. Each of the elements of the ion source, the cathode, the anode, the grid(s), and the neutralizer are maintained at specific electrical potentials to create ions and form those ions into beamlets which combine to form the ion beam.

The most common form of ion optics utilizes a pair of multi-apertured grids: a screen grid adjacent the discharge plasma and an accelerator grid immediately adjacent the screen grid. The extraction grids are usually fabricated from thin sheets of stainless steel, graphite, or molybdenum into which a multitude of apertures are mechanically drilled in a particular pattern and aperture spacing (usually less than 1 mm). While this method of fabrication is generally satisfactory, the mechanical machining can induce substantial internal stresses in the finished grid; these stresses tend to cause undesired distortions when the grids are heated during use. Additionally, the mechanical machining also causes the formation of flakes or chips that can adhere to the grids and adversely affect the beam profile.

The apertures of both the screen and aperture grids are accurately co-aligned, usually by providing alignment pins on the exit end of the ion source and alignment bores in the grid assembly itself so that the grids can be slid onto their mounting pins to assure and maintain a reasonable co-alignment of the various apertures of the screen and accelerator grids. If the apertures of the screen and accelerator grids are accurately co-aligned, the maximum ion-beam current will be obtained with minimum exposure of the material of the grids to ion impingement. If the grid apertures are misaligned, the ions can directly impinge the material of the accelerator grid, thereby lowering the ion beam current, changing the ion beam direction and the trajectory of individual ions, cause undesired variations in the beam profile, erosion of the aperture edges, and possible contamination of the target with accelerator-grid material.

In general, grid misalignment can result from sub-optimal assembly in the field after routine maintenance of the beam source, mis-handling of the grid assembly, over-temperature operation, and changes in the physical dimensions of the grids as a consequence of continued thermal cycling.

Efforts have been made to overcome the problems attendant to the mechanical machining of the grid materials by using semiconductor wafers as a starting material and microelectronic fabrication techniques as disclosed in J. L. Speidell, J. M. E. Harper, J. J. Cuomo, A. W. Kleinsasser, H. R. Kaufman, and A. H. Tuttle "The Fabrication and Use of Silicon and Gallium Arsenide Ion Source Extraction Grids" *J. Vac. Sci. Technol.*, 21(3), Sep./Oct. 1982 pps. 824–827. As disclosed therein, single crystal silicon wafers with a (100) orientation are patterned with an array of rectangular openings to define the grid area and etched to define inverted truncated pyramids bounded by four (111) planes intersecting with the two (100) surfaces of the wafer. Etched silicon grids perform well in comparison to conventional graphite grids, although the problem of aligning the screen and accelerator grids nonetheless remains.

SUMMARY OF THE INVENTION

In view of the above, it is an object of the present invention, among others, to provide a grid assembly for ion beam sources in which multiple apertures can be readily formed in the grids.

It is another object of the present invention to provide a grid assembly for ion beam sources in which long-term alignment is obtained throughout a wide operating temperature range and over a large number of operating cycles.

It is still another object of the present invention to provide a grid assembly for ion beam sources in which the probability of contamination of the grid assembly with sputtered material is acceptably low.

It is a further object of the present invention to provide a method for fabricating a grid assembly for ion beam sources in which long-term aperture alignment is obtained throughout a wide operating temperature range and over a large number of operating cycles.

In view of these objects, and others, the present invention provides a grid assembly for ion beam sources in which the grid structures are etched from a semiconductor wafer using microelectronic fabrication techniques and in which the grid structures are constrained in an aligned manner by a ceramic carrier having embedded electrically conductive pads for effecting electrical contact with the grid structures.

The grid structures are fabricated by creating oxide and photoresist layers on a starting silicon wafer and exposing the photoresist through a mask carrying the aperture pattern. After the photoresist is developed, the oxide layer is etched to form openings therethrough. The remaining resist is removed and the silicon wafer is etched from both sides with the etching proceeding anisotropically with the etch rate in the [100] direction being about 30 times greater (at 80° C.) than in the [111] direction. As a consequence, the (100) plane on the rear surface of the wafer and the {111} planes are etched to form the apertures in which the {111} planes face each other across the aperture with opposite {111} planes at a 90° angle relative to one another and at an angle of 54.74° relative to the (100) plane of the rear surface of the wafer to provide a plurality of apertures each defining a volume in the form of an inverted truncated 4-sided pyramid.

An alternate grid structure is defined by structural beams having a flat-topped and flat-bottomed rhomboidal cross-section to increase the stiffness of the beams when fabricating larger diameter grids. Masks carrying the aperture pattern are overlaid onto the opposite surfaces of the silicon wafer with the apertures of both masks in registration with one another. The photoresist layer is exposed and developed and the $SiO_2$ layer on both sides is etched to form windows on both sides of the wafer. The remaining resist layer is removed, and the silicon wafer is etched from both sides to form apertures that define a volume characterizable as truncated pyramids connected at their truncation surfaces with each pyramid bounded by four (111) planes.

The ceramic carrier is assembled as a preform from a flexible $Al_2O_3$/polymer dielectric tape and is initially fabricated by cutting the various laminae $L_1$, $L_2$, $L_{n-1}$, ... $L_n$ into the desired configuration, including a central opening and mounting holes. The various laminae are aligned in their stacked relationship with conductive pads positioned between the appropriate laminae to function as electrical contacts for the grids. The assembled laminae are subjected to a compression step to assure laminae-to-laminae contact and subjected to a burnout step to remove the organic carriers and to a firing step to form a unitary ceramic carrier. In the preferred embodiment, a screen grid and accelerator grid are cemented into place in the carrier with an electrically conductive high-temperature cement with the aperture alignment carefully controlled to maintain alignment until the cement is cured to mechanically mount the screen and accelerator grids in place and effect electrical connection with their respective conductive pads.

The present invention advantageously provides a grid assembly for ion beam sources and method therefor that possess a number of structural and functional advantages relative to the prior art. A minimum stable grid separation of 100 μm is possible with intergrid distance selectable in increments of the laminae material with the laminae configuration minimizing the probability of intergrid short circuits caused by the sputtering of grid material. Since the grids are bonded permanently in place during assembly, the opportunity for grid misalignment during subsequent operation or field maintenance is low and the thermal coefficients of expansion of the materials are such that the apertures in both grids will remain aligned over a substantial temperature operating range and over a large number of operating cycles.

Other objects and further scope of applicability of the present invention will become apparent from the detailed description to follow, taken in conjunction with the accompanying drawings, in which like parts are designated by like reference characters.

BRIEF DESCRIPTION OF THE DRAWING

FIG. 3 is a partial cross-sectional view of the grid assembly of FIG. 1 taken along line 3—3 of FIG. 1;

FIG. 3A is a partial cross-sectional view of an alternative laminate configuration to that shown in FIG. 3;

FIG. 4 is a representative cross-sectional perspective view of a grid structure;

FIG. 5 is a plan view of a semiconductor starting wafer with a portion of the mask alignment pattern presented;

DESCRIPTION OF THE PREFERRED EMBODIMENT

Figure 1:
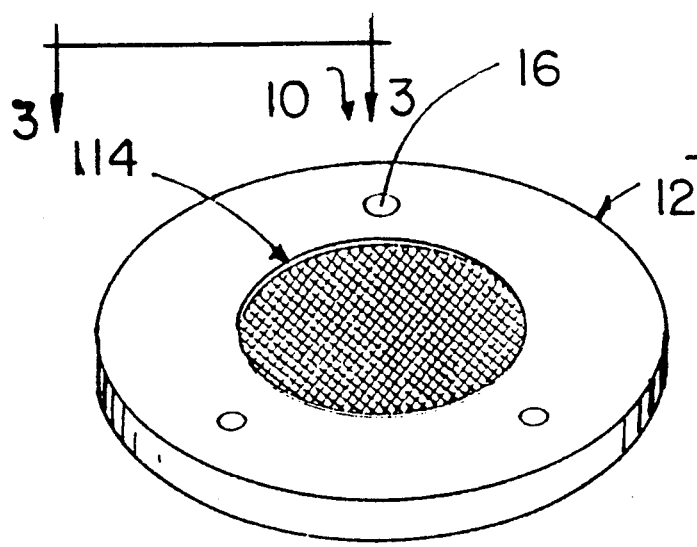
FIG. 1 is a perspective view of an integrated grid assembly for ion beam sources in accordance with the present invention.
Figure 2:
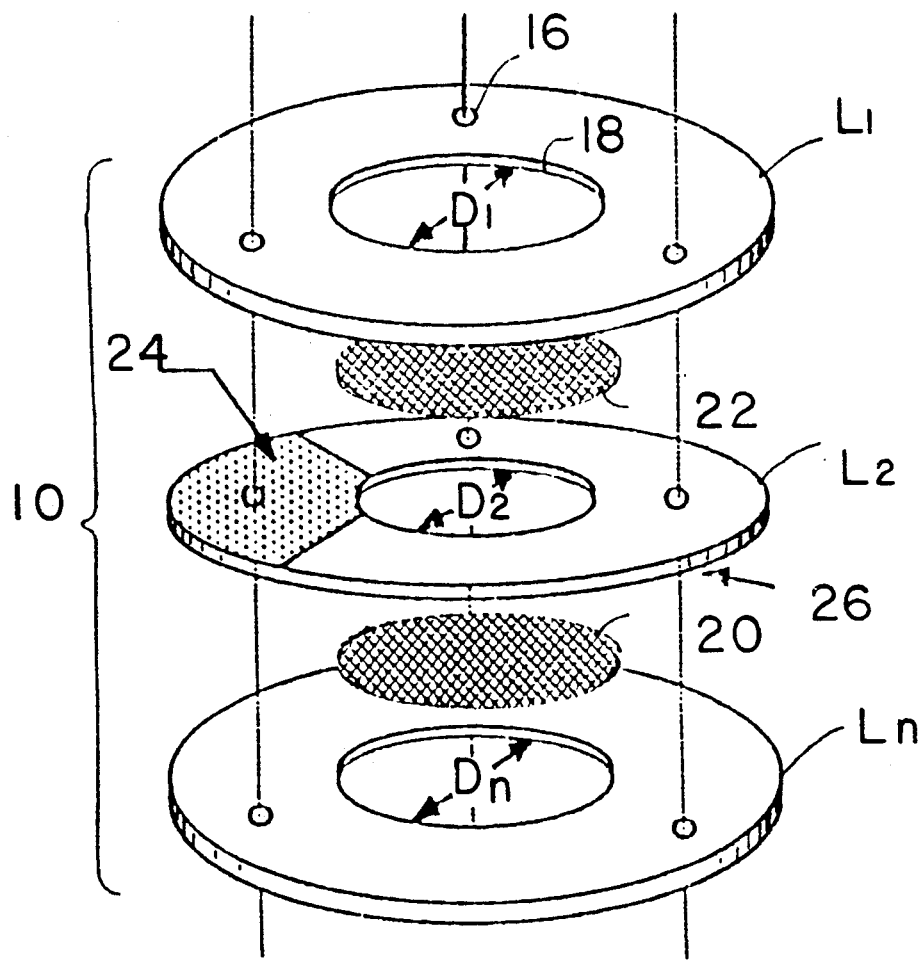
FIG. 2 is an exploded perspective view of the subcomponents of the grid assembly of FIG. 1.

An integrated grid assembly for ion beam sources in accordance with the present invention is shown in FIG. 1 and designated generally therein by the reference character 10. As shown, the grid assembly 10 includes an annular carrier 12 that surrounds and constrains a grid set, generally indicated at 14. As described below, the carrier 12 is assembled as a laminated ceramic and includes equi-spaced mounting holes 16 that are designed to receive alignment pins and/or fasteners at the exit end of an ion source (not shown). As shown in FIG. 2, the carrier 12 is fabricated from a plurality of laminae, indicated generally at $L_1$, $L_2$, and $L_n$, that are eventually 'fired' to formed an integrated ceramic structure having superior dimensional stability over the intended operating temperature of the grid assembly 10. Each laminae $L_n$ includes a central opening 18 of a selected diameter $D_1$, $D_2$, and $D_n$. The grid set 14 includes a screen grid 20 (that faces the plasma zone in the ion source) and an accelerator grid 22 which are constrained between the laminae $L_n$ and $L_2$ and the laminae $L_2$ and $L_1$, respectively.

The intermediate laminae $L_2$ has a conductive pad 24 positioned between and laminated between the laminae $L_1$ and $L_2$ and which is in electrical contact with the accelerator grid 22 using, for example, a conductive electrical cement. The conductive pad 24 functions as an electrical contact for the application of a voltage to the accelerator grid 22 to extract ions through the grid set 14. In similar manner, another electrical pad (not shown) is located on the opposite side of the laminate $L_2$, indicated generally at 26, for effecting electrical connection with the screen grid 20.

FIG. 3 is a cross-section view of a grid assembly 10 in which a larger number of laminae than that shown in FIG. 2 have been assembled to form the carrier 12. In FIG. 3, the carrier 12 is shown in cross-section as a unitary or integral structure with the pre-'fired' laminae boundaries shown in dotted-line illustration. The laminae $L_1$ includes a central opening 18 having a diameter sufficient to accommodate the accelerator grid 22. The immediately adjacent laminae $L_2$ has a central opening 18 of a somewhat smaller diameter to form a circumferential shoulder or ledge (unnumbered) upon which the accelerator grid 22 is mounted and secured with a suitable cement (not shown). A conductive pad (not shown in FIG. 3) is positioned interstitially between the boundary of laminae $L_1$ and $L_2$ to effect electrical contact with the accelerator grid 22 as described above. In a similar manner, the lowermost laminae $L_5$ includes a central opening 18 having a diameter sufficient to accommodate the screen grid 20 with the immediately adjacent laminae $L_4$ having a central opening 18 of a somewhat smaller diameter to form a circumferential ledge (unnumbered) upon which the screen grid 20 is mounted and secured with a suitable cement. A conductive pad (not shown in FIG. 3) is positioned interstitially between the boundaries of the laminae $L_4$ and $L_5$ to effect electrical contact with the screen grid 20 as described above. Intermediate laminae, as represented by laminae $L_3$ in FIG. 3, has a central opening 18 with a diameter greater than that of its immediately adjacent laminae $L_2$ and $L_4$ to provide a circumferential channel, indicated generally at 28, and defined by opposed sidewalls 30 and 32. The formation of the channel 28 extends the operating life of the grid assembly 10 by providing a surface, viz., the sidewall 30, that faces a direction opposite to the target (not shown) to minimize the probability of target atoms being deposited on the sidewall 30 to thus greatly extend the operating life of the grid assembly 10. The intermediate laminae, as explained more fully below, functions as a variable thickness spacer that accurately establishes and maintains the intergrid spacing.

While a single channel 28, as shown in FIG. 3, is desired, multiple channels can be defined by the intermediate laminae between the grids 20 and 22. For example and as shown in FIG. 3A, laminae $L_{1-7}$ are used to assemble the carrier 12 with laminae $L_{2-6}$ configured to provide first and second channels 28a and 28b.

The structure of the screen grid 20 and the accelerator grid 22 are shown in partial perspective in FIG. 4. As shown, each grid is formed from a set of parallel equi-spaced structural beams 34 that intersect with an orthogonal set of parallel equi-spaced structural beams 36 to define a rectangular array of apertures 38. The structural beams 34 and 36 have a trapezoidal cross-section with an exemplary beam having an altitude a = 150 $\mu$m, a base dimension b = 300 $\mu$m, and an aperture dimension c = 700 $\mu$m to provide a grid having a transparency of about 50%. The included angle between the base and sides of the trapezoidal beams is about 55 degrees and is a function of the crystalline structure of the starting material from which the grid is fabricated, typically silicon. As explained below, each aperture 38 is defined by a volume in the form of an inverted, truncated, 4-sided pyramid with the sloped sidewalls aligned along the {111} family of planes at an angle of 54.74° from the {100} planes in the case of a silicon starting material. In FIG. 4, the base dimension b has been intentionally increased from the left to the right to demonstrate that different beam cross-sections can be obtained in a single grid structure.

The screen grid 20 and the accelerator grid 22 are fabricated from a silicon starting wafer 50 (FIG. 5) using microelectronic processing techniques. The starting silicon wafer is preferably a boron-doped (p-type) wafer having a starting thickness of <0.5 mm and polished on both sides and a specific resistance of <10 Ohm-cm. Suitable wafer sources include Wacker-Chemitronic, Burghausen, West Germany. The wafer 50 is initially processed to have a pin-hole free $SiO_2$ thermally grown layer 52 on the opposite sides of the wafer 50, this $SO_2$ layer is at least 1 $\mu$m thick and functions as a mask during the etching step described below. A conventional photoresist layer 54 (with primer) is then coated onto the $SiO_2$ layer on opposite surfaces of the wafer 50 and baked or otherwise processed in accordance with the manufacturer's instructions.

Figure 6:
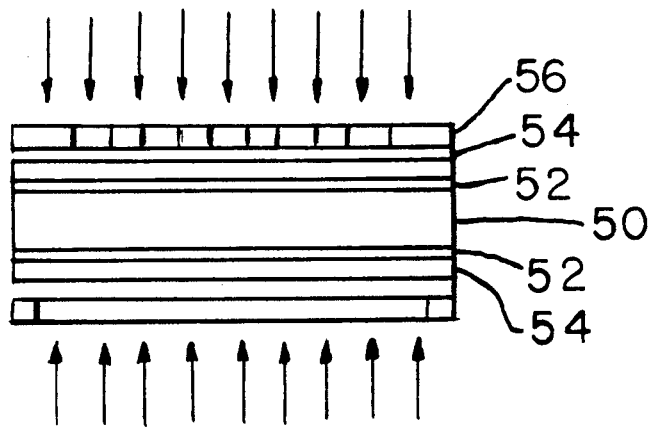
FIG. 6 illustrates the exposure sequence for exposing the top surface pattern and the bottom surface of the starting wafer.
Figure 7:
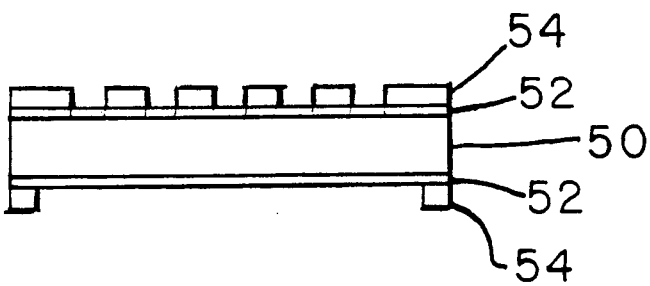
FIG. 7 illustrates the resist development.
Figure 8:
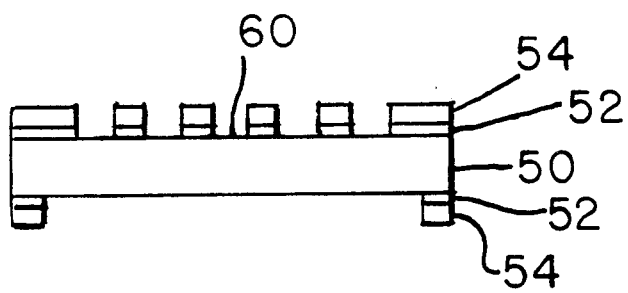
FIG. 8 illustrates the oxide etch.
Figure 9:
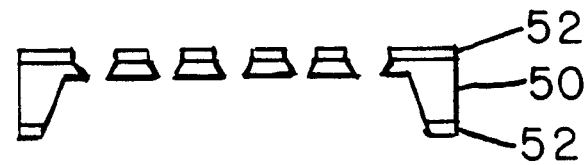
FIG. 9 presents a cross-section of a grid after final etching.

As shown in FIGS. 5 and 6, a mask 56 carrying the aperture pattern is overlaid onto one surface of the wafer 50 within one degree of the [100] direction and the photoresist layer 54 exposed for a sufficient exposure period with light of the appropriate wavelength and intensity. Subsequently, the opposite side of the wafer 50 is fully exposed. As shown in FIG. 7, the resist layer 54 is developed, and, as shown in FIG. 8, the $SiO_2$ layer 52 is etched to form windows 60. Thereafter, the remaining resist layer 54 is removed (not shown), and, as shown in FIG. 9, the silicon wafer 50 is etched from both sides. A suitable etchant includes 20% (by volume) potassium hydroxide (KOH), 16% isopropylalcohol (IPA), and 64% water with the bath temperature at about 57° C. The etching proceeds anisotropically with the etch rate in the [100] direction being about 30 times greater (at 80° C.) than in the [111] direction. As a consequence, the (100) plane on the rear face of the wafer 50 and the {111} planes are etched to form the apertures 38 in which the {111} planes face each other across the aperture 38 with opposite {111} planes at a 90° angle relative to one another and at an angle of 54.74° relative to the (100) plane of the rear surface of the wafer 50 to provide the configuration shown in FIG. 4.

Grid structures fabricated in accordance with the above processing steps and materials provide a grid having a 50% transparency. As can be appreciated, the transparency can be controlled by controlling the duration of the silicon etching. If desired, the exposure of the photoresist (FIG. 6) can be accomplished by the step-and-repeat method in which the aperture spacing can be varied by varying the step distance. As a consequence, the cross-section of selected ones of the structural beams 34 and/or 36 (as represented by the rightmost beam 34 in FIG. 4) can be controlled to increase the beam stiffness when fabricating larger grids. Additionally, the beam profile can likewise be controlled to provide a beam profile that can be characterized, for example, as a flat-topped Gaussian distribution. Further information as to the anisotropic etching of silicon and gallium arsenide is provided by the above-referenced publication, Speidell et al "The Fabrication and Use of Silicon and Gallium Arsenide Ion Source Extraction Grids" *J. Vac. Sci. Technol.*, 21(3), Sep./Oct. 1982 pps. 824-827.

The laminaed carrier 12 is assembled as a preform from a flexible $Al_2O_3$/polymer dielectric tape sold under the Green Tape TM designation by DuPont Electronics of Research Triangle Park, N.C. 27709. The starting film is available from the supplier in various thicknesses between 100 $\mu$m and 300 $\mu$m (or thicker). The carrier 12 is initially fabricated by cutting the various laminae $L_1$, $L_2$, $L_{n-1}$, ... $L_n$ into the desired configuration, for example, as shown generally in FIG. 2. The central opening 18 of each laminae is cut at the correct diameter as discussed above in relation to FIGS. 3 and 3A and, in addition, mounting holes 16 at the appropriate positions are likewise formed. While the various laminae $L_1$, $L_2$, $L_{n-1}$, ... $L_n$ can be steel-rule or die-cut, excellent results have been obtained with a computer-controlled plotter-type cutter. After the laminae are cut from the starting tape, the various laminae $L_1$, $L_2$, $L_{n-1}$, ... $L_n$ are aligned in their stacked relationship with one another. Conductive pads are positioned between the appropriate laminae to function as electrical contacts for the grids as explained below. Suitable conductor materials include various compositions available under the following designations from the above-named supplier: gold layer conductor 5731D, gold layer conductor 5717D, silver/palladium conductor 6144D, and silver conductor 6142D. Preferably, the stacked and aligned lamina are subjected to a pressure-lamination of 2070N/cm$^2$ for 10 minutes at 70° C. to compress the laminae $L_1$, $L_2$, $L_{n-1}$, ... $L_n$ together along their respective boundaries and to fully embed the conductive pads 24 and 26.

The assembled and pressure-laminated preform is placed on an alumina substrate and then subjected to a burnout step and a firing step. During the burnout step, the laminae stack is heated at 380° C. in a convection oven for one hour to volatalize and remove the organic carriers, 85% removal being typical. Thereafter, the burned out stack is subjected to final firing heat for 2 hours with a peak temperature of 850° C. and a dwell time of 15 minutes. If desired, the preform stack can be contained within a mold or holder to insure a measure of dimensional stability during burnout and firing.

After the carrier 12 is fabricated, the screen grid 20 and the accelerator grid 22 are inserted into opposite sides of the carrier 12 and maintained in position with an electrically conductive high-temperature cement, such as Epotek ™ cement supplied by Epoxy Technology, Billerica, Mass. 01821 or a functionally equivalent cement. For larger diameter grid structures, it is desirable that the electrically conductive cement have a measure of resilience to accommodate small differences in the thermal coefficient of expansion between the material of the grid structure and that of the carrier 12. While the cement is still in its viscous state, the apertures 38 of the two grids 20 and 22 are carefully aligned with the alignment maintained until the cement is cured to mechanically mount the grids 20 and 22 in place and effect electrical connection with their respective conductive pads. As an alternative assembly technique, one of the grids can be cemented in place and its cement cured. Thereafter, the other grid is mounted in place and aligned while its cement is uncured and held in its aligned position until curing is complete.

A number of design variables must be considered during the design of the carrier 12. Since the starting film shrinks 12% in the x-y direction and about 17.5% in the z direction, the as-cut dimensions for any laminae $L_n$ must be somewhat larger than the desired final dimensions. Likewise, the number of laminae placed in the stack to control intergrid spacing must likewise accommodate the 17.5% shrinkage in the z direction to arrive at the desired final intergrid spacing.

Figure 10:
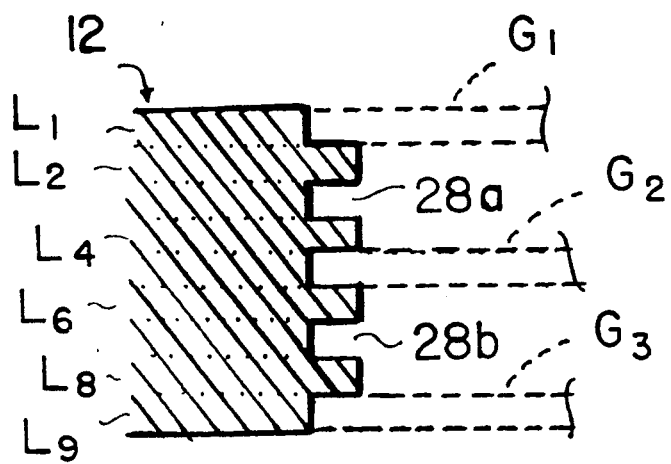
FIG. 10 is a cross-sectional view of a grid assembly having three grids.
Figure 11:
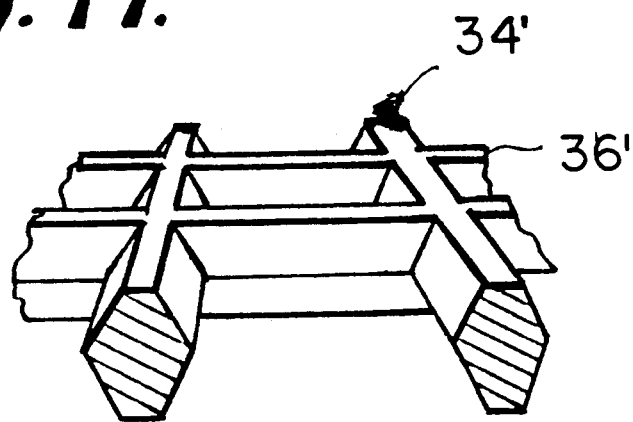
FIG. 11 is a representative cross-sectional perspective view of an alternate grid structure having a beam cross-section different from that of FIG. 4.

Alternatives to the preferred embodiment are shown in FIGS. 10 and 11 which illustrate a three-grid assembly in which at least one grid is embedded in the laminae and a grid structure in which the structural beams have a cross-section characterizable as a flat-topped and flat-bottomed rhomboid.

As shown in FIG. 10, a carrier 12 is fabricated from laminae $L_{1-9}$ in which the even numbered laminae $L_{2,4,6,8}$ have a central opening 18 diameter somewhat less than that of the odd numbered laminae $L_{1,2,3,4}$ to form annular ledges (unnumbered) for a plurality of channels. A first grid $G_1$ is mounted upon the annular ledge defined between the laminae $L_{1-2}$, and a third grid $G_3$ is mounted upon the annular ledge defined between the laminae $L_{8-9}$. The laminae $L_{4-6}$ define a channel (unnumbered) into which a second, intermediate grid $G_2$ is mounted. Since the grid $G_2$ must be embedded in the carrier 12, the assembly steps described above must be modified to incorporate the $G_2$ between the laminae $L_{4-6}$ prior to burnout and firing. Thereafter, the grids $G_1$ and $G_3$ are cemented into place. The conductive pads described above are provided between appropriate laminae for the three grids $G_{1-3}$ to effect electrical connection and, if desired, the electrical connection to the intermediate grid $G_2$ can be effected by mechanical contact with its conductive pad. As shown in FIG. 10, two barrier channels 28a and 28b are provided to extend the operating life of the grid assembly by providing appropriate surfaces facing a direction opposite to the target (not shown) to minimize the probability of target atoms being deposited on the sidewalls of the channels to thus greatly extend the operating life of the grid assembly.

As shown in FIG. 11, an alternate grid structure is defined by structural beams 34' and 36' having a flat-topped and flat-bottomed rhomboidal cross-section. The rhomboidal cross-section increases the stiffness of the structural beams 34' and 36' to increase the stiffness of larger diameter grids. The rhomboidal cross-section is achieved by a modification of the process steps of FIGS. 6-9. More specifically, masks carrying the aperture pattern are overlaid onto the opposite surfaces of the wafer 50 within one degree of the [100] direction with the apertures of both masks in registration with one another. The photoresist layer is exposed for a sufficient exposure period with light of the appropriate wavelength and intensity. The resist layer on both sides is developed and the $SiO_2$ layer on both sides is etched to form windows on both sides of the wafer 50. Thereafter, the remaining resist layer is removed, and the silicon wafer 50 is etched from both sides with the etchant described above. The {111} planes are etched from both sides of the wafer to form the apertures in which the {111} planes face each other across the aperture with opposite {111} planes at a 90° angle relative to one another and at an angle of 54.74° relative to medial plane of the wafer 50. The apertures can be described as at their truncation surfaces with each pyramid bounded by four (111) planes.

While silicon has been described as the preferred grid material, other single crystal materials having a face-centered cubic structure, such as gallium arsenide, are suitable. Additionally, conventional grids, such as those of molybdenum, can be used. While the $Al_2O_3$/polymer dielectric tape is preferred as the starting material for the carrier, other tape compositions, such $MgO/Al_2O_3/SiO_2$/polymer dielectric tapes, which have different thermal coefficients are suitable.

The grid assemblies of the present invention possess a number of structural and functional advantages relative to the prior art. A minimum stable grid separation of 100 μm is possible with intergrid spacing selectable in increments of the post-burnedout thickness of the starting material. The provision of intermediate laminae of different central opening diameters minimizes the probability of intergrid short circuits caused by the sputtering of grid material or target material. Since the grids are bonded permanently to the Al₂O₃ carrier during assembly, the opportunity for grid misalignment during subsequent operation is low and the thermal coefficients of expansions of the materials are such that the apertures in both grids will remain aligned over a substantial temperature range.

As will be apparent to those skilled in the art, various changes and modifications may be made to the illustrated grid assembly for ion beam sources and method therefor of the present invention without departing from the spirit and scope of the invention as determined in the appended claims and their legal equivalent.

What is claimed is:

1. A grid assembly for ion beam sources, comprising:
   a grid structure having an array of apertures for directing ions form an ion source, said grid structure defined by a unitary member having a plurality of orthogonal structural beams defining the array of apertures;
   an electrically insulating carrier surrounding and supporting said grid structure and affixed thereto, said insulating carrier defined as a unitary structure from a fired ceramic and having a central opening defined by at least first and second diameters to define at least a first ledge upon which said grid structures is mounted; and
   a conductive electrode embedded within said carrier and in electrical contact with said grid structure.

2. The grid assembly of claim 1, wherein said conductive electrode contacts said grid structure at said ledge.

3. The grid assembly of claim 2, further comprising:
   an electrically conductive cement between said conductive electrode and said grid structure.

4. The grid assembly for ion beam sources of claim 1, wherein the apertures define volumes characterized as a truncated, four-sided pyramid.

5. The grid assembly for ion beam sources of claim 1, wherein said grid structure is fabricated from a material having a face-centered cubic structure.

6. The grid assembly for ion beam sources of claim 5, wherein said grid structure is fabricated from silicon.

7. A plural-grid assembly for ion beam sources, comprising:
   a first grid structure having a plurality of apertures for directing ions from an ion source;
   a second grid structure having a plurality of apertures for directing ions from an ion source;
   each of said grid structures defined as a unitary member having a plurality of orthogonal structural beams defining a rectangular array of apertures thereof;
   an insulating carrier surrounding and supporting said first and second grip structures in adjacent planes with a fixed intergrid spacing and with the apertures of said first and second grids structures in substantial co-alignment, said insulating carrier defined as a unitary structure from a fired ceramic and having a central opening defined by at least first and second diameters to define at least first and second ledges upon which respective ones of said first and second grid structures is mounted;
   a first conductive electrode embedded within said carrier and in electrical contact with said first grid structure; and
   a second conductive electrode embedded within said carrier and in electrical contact with said second grid structure.

8. The plural-grid assembly of claim 7, wherein said carrier further comprises wall surfaces defining at least one channel on the periphery of the central opening intermediate said first and second grid structures.

9. The plural-grid assembly of claim 7, further comprising:
   an electrically conductive cement between said respective grid structures and their electrical contact.

10. The plural-grid assembly for ion beam sources of claim 7, wherein each of the apertures of said first and second grids define a volume characterized as a truncated, four-sided pyramid.

11. The plural-grid assembly for ion beam sources of claim 7, wherein said grid structures are fabricated from a material having a face-centered cubic structure.

12. The plural-grid assembly for ion beam sources of claim 11, wherein said grid structures are fabricated from silicon.

* * * * *